US010784138B2

(12) United States Patent
Abe

(10) Patent No.: US 10,784,138 B2
(45) Date of Patent: Sep. 22, 2020

(54) SUBSTRATE PROCESSING SYSTEM AND SUBSTRATE TRANSFER METHOD

(71) Applicant: TOKYO ELECTRON LIMITED, Tokyo (JP)

(72) Inventor: Takahiro Abe, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 124 days.

(21) Appl. No.: 15/893,490

(22) Filed: Feb. 9, 2018

(65) Prior Publication Data

US 2018/0233392 A1    Aug. 16, 2018

(30) Foreign Application Priority Data

Feb. 13, 2017  (JP) .................................. 2017-024176

(51) Int. Cl.
  *H01L 21/67*   (2006.01)
  *H01L 21/673*   (2006.01)
  *H01L 21/677*   (2006.01)

(52) U.S. Cl.
  CPC .. *H01L 21/67766* (2013.01); *H01L 21/67017* (2013.01); *H01L 21/67389* (2013.01);
  (Continued)

(58) Field of Classification Search
  None
  See application file for complete search history.

(56) References Cited

U.S. PATENT DOCUMENTS

| 6,039,770 A * | 3/2000 | Yang ................. H01L 21/67017 29/25.01 |
| 2009/0020227 A1* | 1/2009 | Andou ............. H01L 21/67017 156/345.37 |

(Continued)

FOREIGN PATENT DOCUMENTS

| JP | 11-214479 A | 8/1999 |
| JP | 2010-166077 A | 7/2010 |

(Continued)

OTHER PUBLICATIONS

Original and Translation of WO 2017022431 A1; Kawai, Toshihiro et al.; Feb. 9, 2017.*

(Continued)

*Primary Examiner* — Paul J Gray
(74) *Attorney, Agent, or Firm* — Nath, Goldberg & Meyer; Jerald L. Meyer

(57) ABSTRACT

There is provided a substrate processing system, including: a carrier transfer region in which a carrier that accommodates a substrate is transferred to a substrate processing apparatus, and a substrate transfer region in which the substrate accommodated in the carrier is transferred to a processing furnace, the substrate transfer region being partitioned from the carrier transfer region by a partition wall; a transfer port formed in the partition wall and through which the substrate is transferred between the carrier transfer region and the substrate transfer region; an opening/closing door configured to open and close the transfer port; and a pressure equalizing part configured to substantially equalize a pressure of the substrate transfer region and a pressure of a space surrounded by the carrier and the opening/closing door.

6 Claims, 7 Drawing Sheets

(52) U.S. Cl.
CPC .. *H01L 21/67769* (2013.01); *H01L 21/67772* (2013.01); *H01L 21/67775* (2013.01)

(56) References Cited

U.S. PATENT DOCUMENTS

2016/0172185 A1* 6/2016 Yamakawa ............ G01N 21/33
                                                                205/335
2018/0204753 A1* 7/2018 Kawai ................... H01L 21/677

FOREIGN PATENT DOCUMENTS

| JP | 2011-228397 A | 11/2011 |
| WO | 2017/022431 A1 | 2/2017 |

OTHER PUBLICATIONS

Original and Translation of WO 2016035675 A1; Sakata Katsunori et al.; Mar. 10, 2016.*

* cited by examiner

SUBSTRATE PROCESSING SYSTEM AND SUBSTRATE TRANSFER METHOD

CROSS-REFERENCE TO RELATED APPLICATION

This application is based upon and claims the benefit of priority from Japanese Patent Application No. 2017-024176, filed on Feb. 13, 2017, the entire contents of which are incorporated herein by reference.

TECHNICAL FIELD

The present disclosure relates to a substrate processing system and a substrate transfer method.

BACKGROUND

Conventionally, in a semiconductor manufacturing process, there is a case where a plurality of types of processes are performed by different processing apparatuses. In this case, when a semiconductor wafer (hereinafter, simply referred to as a "wafer") is transferred between the processing apparatuses, a substrate storage vessel (carrier) called a front-opening unified pod (FOUP) is used. The FOUP includes a vessel on which a plurality of wafers can be horizontally mounted and a lid for closing an entrance formed in a front surface of the vessel, and is configured such that the wafers can be hermetically sealed.

In the processing apparatus, a transfer port through which the wafers received in the carrier are loaded into a wafer transfer region is formed. The transfer port is opened and closed by an opening/closing door that is in compliance with a front-opening interface mechanical standard (FIMS). The opening/closing door includes a lid opening/closing mechanism for removing the lid installed in the front surface of the FOUP.

The removal of the lid is performed in the following manner. First, in a state which the front surface of the FOUP is in close contact with the transfer port of the processing apparatus, the lid opening/closing mechanism advances toward the lid of the FOUP and acts on a locking mechanism installed in the lid to release the lock state. Subsequently, the lid opening/closing mechanism is retracted in the direction of the wafer transfer region inside the processing apparatus while holding the lid thus unlocked, and the wafers received in the FOUP are opened to the wafer transfer region.

When opening the FOUP, an inert gas is supplied to a space between the opening/closing door and the FOUP so that the interior of the FOUP is replaced by the inert gas. In this manner, the wafers are loaded into the processing apparatus in a state in which the wafers unloaded from the FOUP are not exposed to oxygen and no oxygen enters the processing apparatus.

In the above-mentioned method, however, in a case where the pressure of the space between the opening/closing door and the FOUP is different from that of the substrate transfer region, when the wafers received in the FOUP are exposed to the wafer transfer region, a gas flowing from one to the other due to such a pressure difference is generated. This may cause scattering of particles.

SUMMARY

The present disclosure provides some embodiments of a substrate processing system capable of suppressing scattering of particles.

According to one embodiment of the present disclosure, there is provided a substrate processing system, including: a carrier transfer region in which a carrier that accommodates a substrate is transferred to a substrate processing apparatus, and a substrate transfer region in which the substrate accommodated in the carrier is transferred to a processing furnace, the substrate transfer region being partitioned from the carrier transfer region by a partition wall; a transfer port formed in the partition wall and through which the substrate is transferred between the carrier transfer region and the substrate transfer region; an opening/closing door configured to open and close the transfer port; and a pressure equalizing part configured to substantially equalize a pressure of the substrate transfer region and a pressure of a space surrounded by the carrier and the opening/closing door.

According to another embodiment of the present disclosure, there is provided a substrate transfer method for use in a substrate processing system, wherein the substrate processing system includes: a carrier transfer region in which a carrier that accommodates a substrate is transferred to a substrate processing apparatus, and a substrate transfer region in which the substrate accommodated in the carrier is transferred to a processing furnace, the substrate transfer region being partitioned from the carrier transfer region by a partition wall; a transfer port formed in the partition wall and through which the substrate is transferred between the carrier transfer region and the substrate transfer region; an opening/closing door configured to open and close the transfer port; and a pressure equalizing part configured to substantially equalize a pressure of the substrate transfer region and a pressure of a space surrounded by the carrier and the opening/closing door, the method including substantially equalizing the pressure of the substrate transfer region and the pressure of the space before the substrate transfer region and the space communicate with each other.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
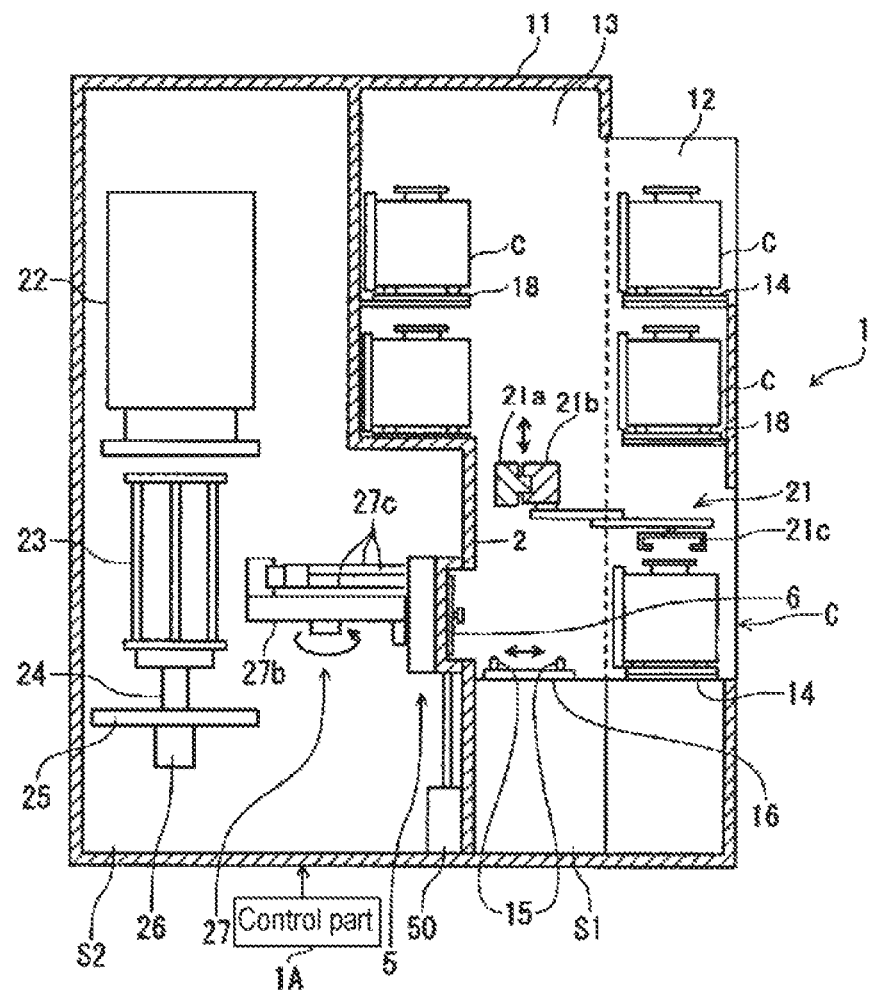
FIG. 1 is a cross sectional view of a substrate processing system according to an embodiment of the present disclosure.

Hereinafter, modes for carrying out the present disclosure will be described with reference to the drawings. Further, in the present specification and the drawings, substantially like components are given like reference numerals and a repeated description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
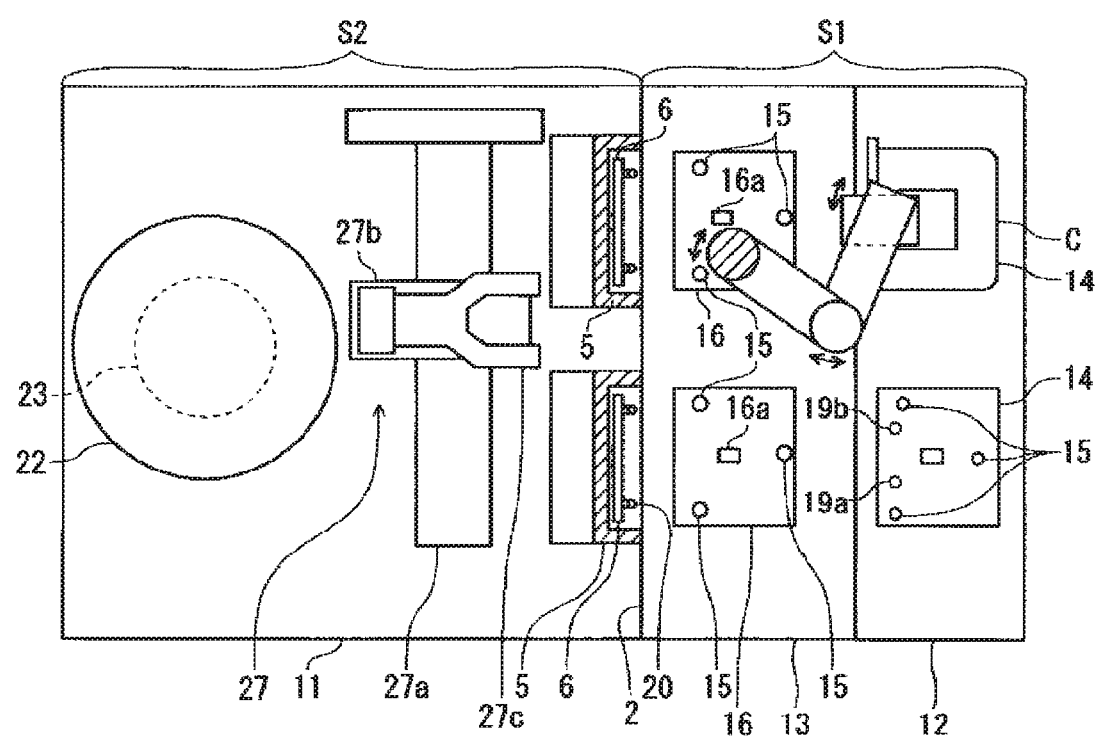
FIG. 2 is a plan view of the substrate processing system in FIG. 1.

A substrate processing system according to an embodiment of the present disclosure will be described. FIG. 1 is a cross sectional view of a substrate processing system according to an embodiment of the present disclosure. FIG. 2 is a plan view of the substrate processing system in FIG. 1. Furthermore, in the embodiment, a substrate processing system including a vertical heat treatment apparatus equipped with a vertical heat treatment furnace will be described as an example. However, the present disclosure is not limited thereto and may be applied to a substrate processing system including various substrate processing apparatuses other than the vertical heat treatment apparatus.

As illustrated in FIG. 1 and FIG. 2, a vertical heat treatment apparatus 1 is configured to be accommodated in a housing 11. The housing 11 constitutes an outer covering body of the vertical heat treatment apparatus 1. The housing 11A has a carrier transfer region S1 and a wafer transfer region S2 defined therein. In the carrier transfer region S1, a carrier C as a vessel that accommodates wafers W is carried into and out of the vertical heat treatment apparatus 1. The wafer transfer region S2 is a transfer region in which the wafers W accommodated in the carrier C are transferred and loaded into a heat treatment furnace 22 as described hereinbelow. The carrier C is, for example, a substrate storage vessel called a front-opening unified pod (FOUP).

The carrier transfer region S1 and the wafer transfer region S2 are partitioned by a partition wall 2. The carrier transfer region S1 is a region kept in an air atmosphere and in which the wafers W accommodated in the carrier C are transferred. A region between respective processing apparatuses corresponds to the carrier transfer region S1. In this embodiment, a space in a clean room outside the vertical heat treatment apparatus 1 corresponds to the carrier carrying region S1. On the other hand, the wafer transfer region S2 is kept in an inert gas atmosphere, for example, a nitrogen ($N_2$) gas atmosphere, in order to prevent oxide films from being formed on the loaded wafer W. The wafer transfer region S2 is higher in cleanliness but lower in oxygen concentration than the carrier transfer region S1. In the following description, the arrangement direction of the carrier transfer region S1 and the wafer transfer region S2 will be defined as the front-rear direction of the vertical heat treatment apparatus 1.

A transfer port 20 through which the wafer W is transferred is formed in the partition wall 2 between the carrier transfer region S1 and the wafer transfer region S2. An opening/closing door 5 for opening and closing, the transfer port 20 is installed in the transfer port 20. A lid opening/closing mechanism 6 is installed at the side of the carrier transfer region S1 in the opening/closing door 5. The transfer port 20, the opening/closing door 5, and the lid opening/closing mechanism 6 are in compliance with a front-opening interface mechanical standard (FIMS).

The carrier transfer region S1 includes a first transfer region 12 and a second transfer region 13 positioned at a rear side of the first transfer region 12 (i.e., the side of the wafer transfer region S2).

As illustrated in FIG. 1, in the first transfer region 12, load ports 14 are arranged in two stages in a vertical direction and a carrier storage shelf 18. The load ports 14 are loading tables for receiving the carrier C when the carrier C is loaded into the vertical heat treatment apparatus 1. The load ports 14 are installed at places where the wall of the housing 11 is opened, and are configured to be accessible to the vertical heat treatment apparatus 1 from the outside. Specifically, the load ports 14 are configured such that the carrier C can be loaded on the load ports 14 by a carrier transfer device (not shown) installed outside the vertical heat treatment apparatus 1, and the carrier C can be unloaded from the load ports 14 to the outside. Furthermore, the load ports 14 are arranged in two stages in the vertical direction so that the carriers C can be independently loaded on and unloaded from the respective load ports 14.

In addition, the carrier storage shelf 18 is installed between the load ports 14 arranged in two stages in the vertical direction in the first transfer region 12. The carrier storage shelf 18 is also installed in the second transfer region 13. Further, the carrier storage shelf 18 may also be installed at a place where the load ports 14 of the first transfer region 12 do not exist, in order to store the carriers C inside the vertical heat treatment apparatus 1 as much as possible.

As illustrated in FIG. 2, two load ports 14 on which the carriers C are respectively mounted may be installed side by side in a left-right direction of the first transfer region 12. In FIG. 2, the load ports 14 of the lower stage side in FIG. 1 are illustrated, but the load ports 14 of the upper stage side may also be installed side by side at plural places in the left-right direction. In addition, pins 15 for positioning the carrier C are installed, for example, at three places, on the loading surface of each of the load ports 14.

A supply nozzle 19a and an exhaust nozzle 19b may be installed in the load port 14. An intake port and an exhaust port are generally formed in the bottom surface of the carrier C. Therefore, when the carrier C is loaded, in the load port 14, the supply nozzle 19a may be installed at a position where the supply nozzle 19a is fitted into the intake port of the carrier C, and the exhaust nozzle 19b may be installed at a position where the exhaust nozzle 19b is fitted into the exhaust port of the carrier C. By installing the supply nozzle 19a and the exhaust nozzle 19b when the carrier C is loaded on the load port 14, an inert gas such as an $N_2$ gas may be supplied into the carrier C so that the interior of the carrier C can be replaced by the inert gas. Thus, the space is filled with the inert gas. However, the carrier C which has been transferred in a state in which no inert gas is supplied, is supplied with the inert gas immediately when being loaded on the load port 14 in the vertical heat treatment apparatus 1. As a result, the interior of the carriers C can be continuously maintained in a clean state.

Furthermore, the replacement of the interior of the carrier C by the inert gas on the load port 14 can be performed even when the carrier C in which the processed wafers W are accommodated is unloaded from the vertical heat treatment apparatus 1. Thus, the replacement of the interior of the carrier C loaded on the load port 14 by the inert gas may be performed even when unloading the carrier C from the vertical heat treatment apparatus 1.

In the inert gas replacements on the load port 14, a flow rate of the inert gas supplied to the carrier C is required to be 1 (l/min) or more in the case of the $N_2$ gas. Specifically, the flow rate of the inert gas may be set to fall within a range of, for example, 10 to 20 (l/min), specifically 13 to 17 (l/min), more specifically 15 (l/min).

Two carrier loading tables 16 are arranged in the second transfer region 13 in the left-right direction such that they are arranged in the front-rear direction with respect to the load ports 14. Each of the carrier loading, tables 16 is configured to be movable in the front-rear direction. Similar to the load port 14, three pins 15 for positioning the carrier C are installed in a loading surface of each of the carrier loading tables 16. Furthermore, a hook 16a for fixing the carrier C is also installed in the loading surface of each of the carrier loading tables 16. In this embodiment, the two carrier loading tables 16 are shown to be installed side by side in the left-right direction. However, a plurality of carrier loading tables may be installed side by side in the vertical direction.

As illustrated in FIG. 1, the carrier storage shelf 18 for receiving the carrier C thereon is installed at the upper side of the second transfer region 13. The carrier storage shelf 18 is configured by two or more stages of shelves. Each of the shelves can load two carriers C at the left and right sides. In FIG. 1, there is shown an example in which two stages of shelves are installed. The carrier storage shelf 18 may also be referred to as a stocker.

In some embodiments, similar to the load port 14, a supply nozzle and an exhaust nozzle may be installed in a bottom surface of the carrier storage shelf 18 so that the atmosphere within the carrier C loaded on the carrier storage shelf 18 is replaced using the inert gas. In replacing the atmosphere of the carrier storage shelf 18, a flow rate of the inert gas supplied to the carrier C may be similar to that of the load port 14. For example, the flow rate of the inert gas is required to be 1 (1/min) or more in the case of the $N_2$ gas. Specifically, the flow rate of the inert gas may be set to fall within a range of, for example, 10 to 20 (l/min), specifically 13 to 17 (1/min), more specifically 15 (l/min).

As described above, in the load port 14 and the carrier storage shelf 18, replacement of the atmosphere using the inert gas at a low flow rate may be performed. Since the carrier C, such as the FOUP, is not completely sealed, the replacement of the atmosphere within the carrier C using the inert gas may be continuously performed to maintain humidity using the lid opening/closing mechanism 6 even after the atmosphere of a closed space 54 (to be described later) is replaced using the inert gas. Therefore, replacing the atmosphere using the inert gas may be continuously performed even in the load port 14 and the carrier storage shelf 18. In addition, as described above, an inert gas having a flow rate of 1 (l/min) or more is necessary to continuously maintain the humidity in the carrier C using the lid opening/closing mechanism 6 even after the atmosphere is replaced.

A carrier transfer mechanism 21 is installed in the second transfer region 13 to transfer the carrier C between the load ports 14, the carrier loading tables 16, and the carrier storage shelf 18. The carrier transfer mechanism 21 includes a guide portion 21a which is extendible in the left-right direction and is movable up and down, a moving portion 21b which moves in the left-right direction while being guided by the guide portion 21a, and a joint arm 21c which is installed in the moving portion 21b and horizontally transfers the carrier C while holding the carrier C.

The transfer port 20 through which the wafer W is transferred is formed in the partition wall 2 so that the carrier transfer region S1 and the water transfer region S2 are brought into communicate with each other. The opening/closing door 5 for closing the transfer port 20 from the side of the wafer transfer region S2 is installed in the transfer port 20. A driving mechanism 50 is connected to the opening/closing door 5. The opening/closing door 5 is configured to be movable in the front-rear direction and in the vertical direction by the driving mechanism 50 so that the transfer port 20 is opened and closed. Details of the configuration around the opening/closing door 5 and the transfer port 20 will be described hereinbelow.

The vertical heat treatment furnace 22 with its lower end opened as a furnace opening is installed in the wafer transfer region S2. Below the heat treatment furnace 22, a wafer boat 23 configured to hold a plurality of wafers W in a shelf-like manner is placed on a cap 25 via a heat insulating part 24. The cap 25 is supported on an elevating mechanism 26. The wafer boat 23 is carried into or out of the heat treatment furnace 22 by the elevating mechanism 26.

A wafer transfer mechanism 27 is installed between the wafer boat 23 and the transfer port 20 of the partition wall 2. The wafer transfer mechanism 27 moves along a guide mechanism 27a extending in the left-right direction, and includes, for example, five arms 27c which are movable forward and backward and are installed in a moving body 27b configured to rotate around a vertical axis. With this configuration, the water W is transferred between the wafer boat 23 and the carrier C loaded on the carrier loading table 16.

In addition, a control part 1A including, for example, a computer, is installed in the vertical heat treatment apparatus 1. The control part 1A includes a program, a memory, a data processing part provided with a CPU, and the like. The program incorporates an instruction (each step) so that the control part 1A sends a control signal to each part of the vertical heat treatment apparatus 1 so as to execute each processing step as already described above. The transfer operation of the carrier C, the transfer operation of the wafers W, the opening/closing operation of the lid 41, the opening and closing operation of the opening/closing door 5, the supply operation of the inert gas into the carrier C, and the opening and closing operation of an opening/closing valve 82 (to be described later) controlled by the control signal. In this manner, the wafers W are transferred and processed. The program is stored in a computer storage medium, for example, a storage medium such as a flexible disk, a compact disc, a hard disk, a magneto-optical disc (MO), a memory card or the like, and is installed on the control part 1A.

Figure 3:
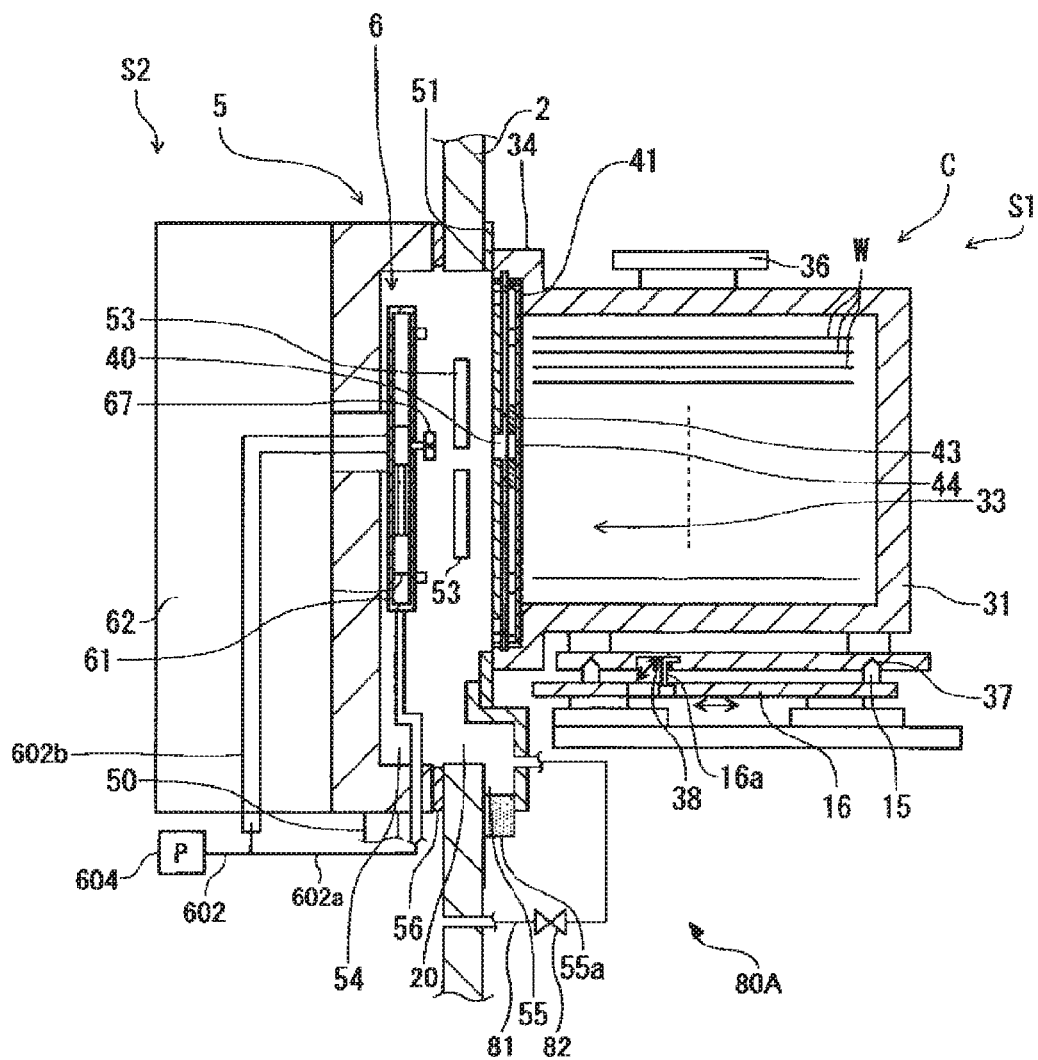
FIG. 3 is a vertical cross sectional view illustrating a first configuration example of a pressure equalizing part of the substrate processing system in FIG. 1.
Figure 4:
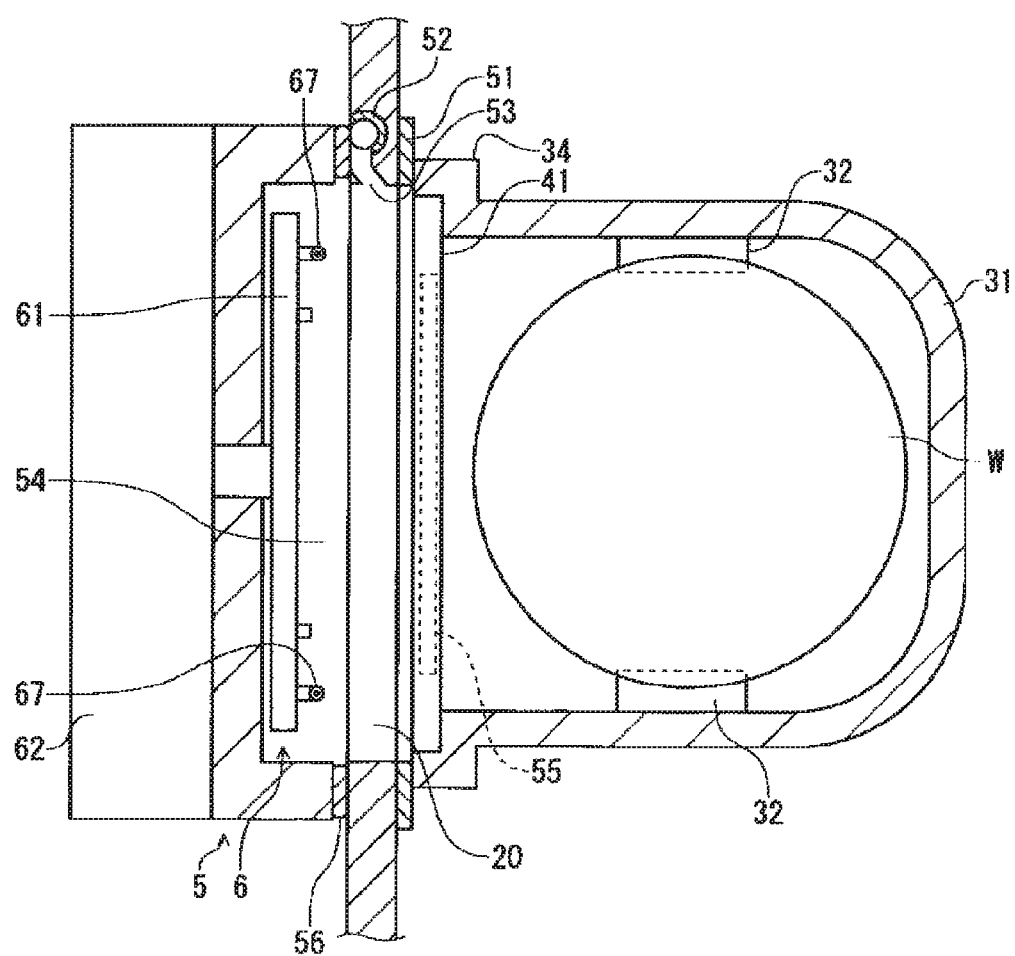
FIG. 4 is a cross sectional view around an opening/closing door of the substrate processing system in FIG. 1.

FIG. 3 is a vertical cross sectional view illustrating a first configuration example of a pressure equalizing part of the substrate processing system in FIG. 1. FIG. 4 is a cross sectional view around the opening/closing door 5 of the substrate processing system in FIG. 1. In FIG. 3 and FIG. 4, there is shown a state in which the carrier C is moved to a transfer position from which the wafers W are transferred to the wafer transfer region S2 by the carrier loading table 16.

The carrier C will be now described. The carrier C includes a carrier body 31 as a vessel body and a lid 41. Support portions 32 for supporting rear peripheral portions of the respective wafers W are installed at left and right sides of the carrier body 31 in multiple stages. An outlet 33 through which the wafers W is picked up is formed in a front surface of the carrier body 31.

A grip portion 36 for gripping the carrier C when the carrier transfer mechanism 21 transfers the carrier C is installed above the carrier body 31. A recess 37 and a groove portion 38 are formed in a lower portion of the carrier body 31. The recess 37 is fitted into the respective pin 15 of the load port 14 and the carrier loading table 16. The groove portion 38 engages with the hook 16a of the carrier loading table 16. The carrier body 31 is fixed to the carrier loading table 16 by the engagement between the groove portion 38 and the hook 16*a*.

A disk-shaped rotation portion 43 which rotates around a horizontal axis is installed in the lid 41. The rotation portion 43 has an engaging hole 44 formed therein, which engages with a latch key 67. By rotating the rotation portion 43 by 90 degrees, the lid 41 is fixed to the carrier body 31. For example, the carrier C includes such a locking mechanism so that the lid 41 can be locked to the carrier body 31.

An outlet 40 into which the latch key 67 is inserted is opened in the front surface of the lid 41 so as to overlap with the engaging hole 44 of the rotation portion 43. The latch key 67 is inserted into the outlet 40 and reaches the engaging hole 44. In this state, by rotating the rotation portion 43, it is possible to release the lock of the carrier C with respect to the lid 41.

The opening/closing door 5 and the transfer port 20 of the wafers W will be now described. In an inlet edge portion of the transfer port 20 at the side of the carrier transfer region S1, a seal member 51 is installed at a position with which an opening edge portion 34 of the carrier body 31 is brought into contact. An inert gas supply pipe 52 is vertically installed in a side edge portion side of the transfer port 20. The inert gas supply pipe 52 has gas supply ports 53 extending in the vertical direction at upper and lower sides, and supplies an inert gas to the closed space 54 surrounded by the carrier C and the opening/closing door 5 at the transfer position of the wafer W. A horizontally-extending exhaust port 55 is formed in a lower end portion of the transfer port 20. A porous body 55*a* is installed in the exhaust port 55 to suppress deviation of exhaust in the left-right direction.

The opening/closing door 5 is formed as a box body whose peripheral portion is bent toward the side of the carrier transfer region S1 and is bent so as to have a recess shape as a whole. A seal member 56 is installed in an opening edge of the opening/closing door 5 constituting the box body. The opening/closing door 5 is in close contact with the edge portion of the transfer port 20 via the seal member 56.

The lid opening/closing mechanism 6 for removing the lid 41 is installed at the side of the carrier transfer region S1 in the opening/closing door 5. The lid opening/closing mechanism 6 includes a facing plate 61 which faces the lid 41 and accommodates a driving mechanism of the lid opening/closing mechanism 6. The facing plate 61 is configured to be movable in the front-rear direction by a reciprocating mechanism 62.

A driving mechanism of a mechanical portion for driving the lid opening/closing mechanism 6 is accommodated inside the facing plate 61. If necessary, an exhaust port 602 may be connected to an internal space of the facing plate 61. The exhaust port 602 is connected to a vacuum pump 604 so that the internal space of the facing plate 61 can be exhausted. In FIG. 3, the exhaust port 602 includes two exhaust ports, namely a lower exhaust port 602*a* connected to a lower portion of the facing plate 61 and a central exhaust port 602*b* connected to a central portion of the facing plate 61. The lower and central exhaust ports 602*a* and 602*b* are joined so that the exhaust port 602 is consequently connected to the vacuum pump 604. The exhaust port 602 may be installed at various places communicating with the internal space of the facing plate 61 as long as the internal space of the facing plate 61 can be exhausted. Also, the number of the exhaust ports 602 may be varied depending on the intended use.

Furthermore, the vertical heat treatment apparatus 1 includes a pressure equalizing part 80A configured to substantially equalize the pressure of the wafer transfer region S2 and the pressure of the closed space 54 surrounded by the carrier C and the opening/closing door 5. The pressure equalizing part 80A includes a connection pipe 81 and an opening/closing valve 82.

The connection pipe 81 is a gas pipe for connecting the wafer transfer region S2 and the closed space 54. One end of the connection pipe 81 communicates with the wafer transfer region S2 at the lower portion of the transfer port 20, and the other end thereof communicates with the closed space 54 around the exhaust port 55. The connection pipe 81 may be a fluororesin tube such as a polytetrafluoroethylene (PTFE) tube. This provides a filtering effect of removing particles or the like generated inside the connection pipe 81 when opening and closing the opening/closing valve 82 by electrification of the tube.

The opening/closing valve 82 is installed in the connection pipe 81. By opening the opening/closing valve 82, the wafer transfer region S2 and the closed space 54 which are connected to each other via the connection pipe 81 communicate with each other so that the pressure of the wafer transfer region S2 and the pressure of the closed space 54 become substantially equal to each other. Furthermore, the phrase "substantially equal pressure" means that they are the same or the absolute value of a difference between the two pressures is less than 400 Pa. The operation of the opening/closing valve 82 is controlled by the control part 1A. The control part 1A opens the opening/closing valve 82, for example, before separating the opening/closing door 5 that is in close contact with the edge portion of the transfer port 20 via the seal member 56 from the edge portion of the transfer port 20. Thus, the wafer transfer region S2 and the closed space 54 communicate with other so that the pressure of the wafer transfer region S2 and the pressure of the closed space 54 become substantially equal to each other. Therefore, when the opening/closing door 5 is separated from the edge portion of the transfer port 20, the flow of a gas does not occur from the wafer transfer region S2 toward the closed space 54 or from the closed space 54 toward the wafer transfer region S2. As a result, it is possible to suppress scattering of particles between the wafer transfer region S2 and the closed space 54.

Figure 5:
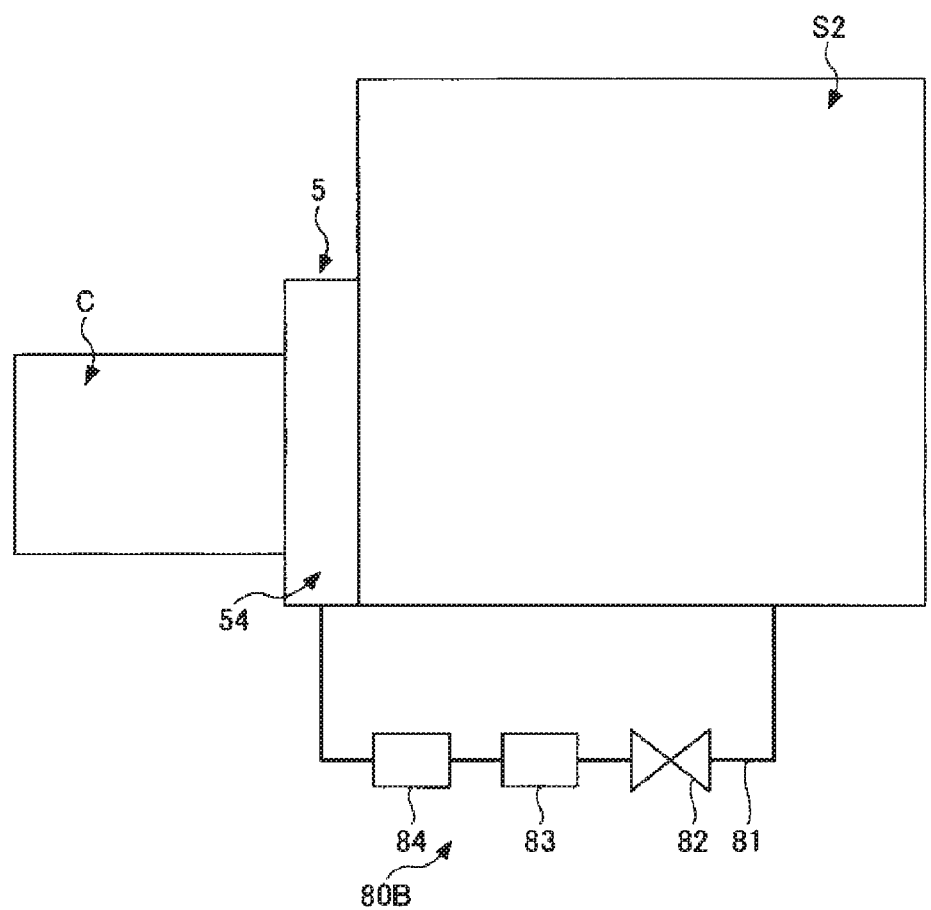
FIG. 5 is a schematic diagram illustrating a second configuration example of the pressure equalizing part of the substrate processing system in FIG. 1.

FIG. 5 is a schematic diagram illustrating a second configuration example of the pressure equalizing part of the substrate processing system in FIG. 1. As illustrated in FIG. 5, a pressure equalizing part 80B of the second configuration example is different from that of the first configuration example, in that a filter 83 and an orifice 84, in addition to the opening/closing valve 82, are installed in the connection pipe 81.

The pressure equalizing part 80B includes the connection pipe 81, the opening/closing valve 82, the filter 83, and the orifice 84.

The connection pipe 81 is a gas pipe for connecting the wafer transfer region S2 and the closed space 54. One end of the connection pipe 81 communicates with the wafer transfer region S2, and the other end thereof communicates with the closed space 54.

The opening/closing valve 82 is installed in the connection pipe 81. By opening the opening/closing valve 82, the wafer transfer region S2 and the closed space 54 which are connected to each other via the connection pipe 81 communicate with each other so that the pressure of the wafer transfer region S2 and the pressure of the closed space 54 become substantially equal to each other. The operation of the opening/closing valve 82 is controlled by the control part 1A. The control part 1A opens the opening/closing valve 82, for example, before separating the opening/closing door 5 that is in close contact with the edge portion of the transfer port 2C) via the seal member 56 from the edge portion of the transfer port 20. Thus, the wafer transfer region S2 and the closed space 54 communicate with each other so that the pressure of the wafer transfer region S2 and the pressure of the closed space 54 become substantially equal to each other. Therefore, when the opening/closing door 5 is separated from the edge portion of the transfer port 20, the flow of gas does not occur from the wafer transfer region S2 toward the closed space 54 or from the closed space 54 toward the wafer transfer region S2. As a result, it is possible to suppress scattering of particles between the wafer transfer region S2 and the closed space 54.

The filter 83 is installed between the closed space 54 and the opening/closing valve 82 in the connection pipe 81. The filter 83 removes particles or the like generated inside the connection pipe 81 when opening and closing the opening/closing valve 82. While in FIG. 5, a case where the filter 83 is installed between the opening/closing door 5 and the opening/closing valve 82 in the connection pipe 81 is illustrated, the present disclosure is not limited thereto. As an example, the filter 83 may be installed between the wafer transfer region S2 and the opening/closing valve 82 in the connection pipe 81. Alternately, the filter 83 may be installed between the opening/closing door 5 and the opening/closing valve 82 in the connection pipe 81, and between the wafer transfer region S2 and the opening/closing valve 82 in the connection pipe 81.

The orifice 84 is installed between the closed space 54 and the filter 83 in the connection pipe 81. The orifice 84 suppresses pressure from suddenly fluctuating when opening the opening/closing valve 82. While in FIG. 5, a case where the orifice 84 is installed between the closed space 54 and the filter 83 in the connection pipe 81 is illustrated, the present disclosure is not limited thereto. In some embodiments, the orifice 84 may be installed at another position in the connection pipe 81.

Figure 6:
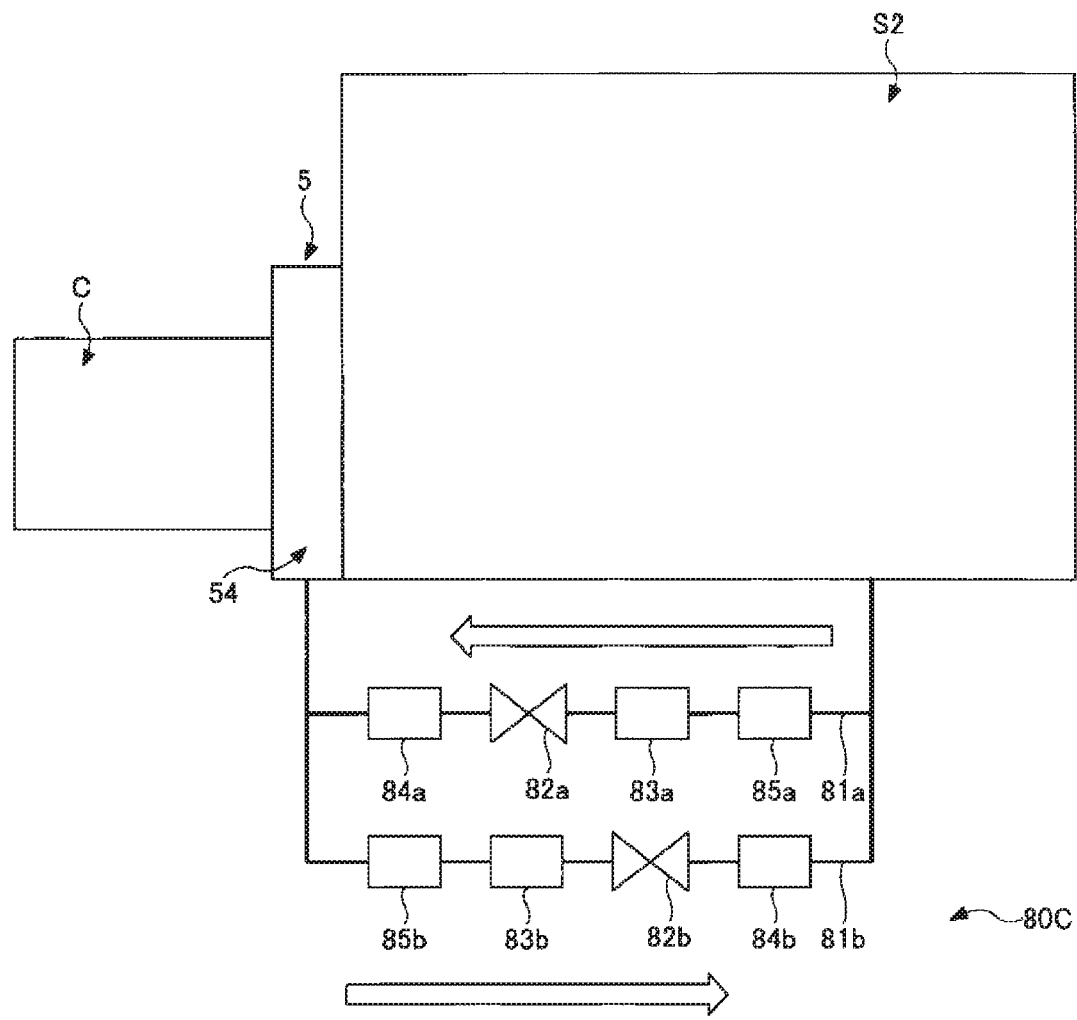
FIG. 6 is a schematic diagram illustrating a third configuration example of the pressure equalizing part of the substrate processing system in FIG. 1.

FIG. 6 is a schematic diagram illustrating a third configuration example of the pressure equalizing part of the substrate processing system in FIG. 1. As illustrated in FIG. 6, a pressure equalizing part 80C of the third configuration example is different from that of the first configuration example, in that it includes two systems of connection pipes.

The pressure equalizing part 80C includes a first connection pipe 81a and a second connection pipe 81b.

The first connection pipe 81a is a gas pipe for connecting the wafer transfer region S2 and the closed space 54. One end of the first connection pipe 81a communicates with the wafer transfer region S2, and the other end thereof communicates with the closed space 54. A check valve 85a, a filter 83a, an opening/closing valve 82a, and an orifice 84a are installed in the first connection pipe 81a sequentially from the side of the wafer transfer region S2.

The second connection pipe 81b is a gas pipe for connecting the wafer transfer region S2 and the closed space 54. One end of the second connection pipe 81b communicates with the wafer transfer region S2, and the other end thereof communicates with the closed space 54. A check valve 85b, a filter 83b, an open/close valve 82b, and an orifice 84b are installed in the second connection pipe 81b sequentially from the side of the closed space 54.

The opening/closing valve 82a and the opening/closing valve 82b are controlled to operate in conjunction with each other by the control part 1A. The control part 1A opens the opening/closing valve 82a and the opening/closing valve 82b, for example, before separating the opening/closing door 5 that is in close contact with the edge portion of the transfer port 20 via the seal member 56 from the edge portion of the transfer port 20. Thus, the wafer transfer region S2 and the closed space 54 communicate with each other so that the pressure of the wafer transfer region S2 and the pressure of the closed space 54 become substantially equal to each other. Specifically, when the pressure of the wafer transfer region S2 is higher than the pressure of the closed space 54, the gas in the wafer transfer region S2 flows through the first connection pipe 81a to the closed space 54, whereby the pressure of the wafer transfer region S2 and the pressure of the closed space 54 become substantially equal to each other. On the other hand, when the pressure of the wafer transfer region S2 is lower than the pressure of the closed space 54, the gas in the closed space 54 flows through the second connection pipe 81b to the wafer transfer region S2, whereby the pressure of the wafer transfer region S2 and the pressure of the closed space 54 become substantially approximately equal to each other. Therefore, when the opening/closing door 5 is separated from the edge portion of the transfer port 20, the flow of gas does not occur from the wafer transfer region S2 toward the closed space 54 or from the closed space 54 toward the wafer transfer region S2. As a result, it is possible to suppress panicles from scattering between the wafer transfer region S2 and the closed space 54.

Figure 7:
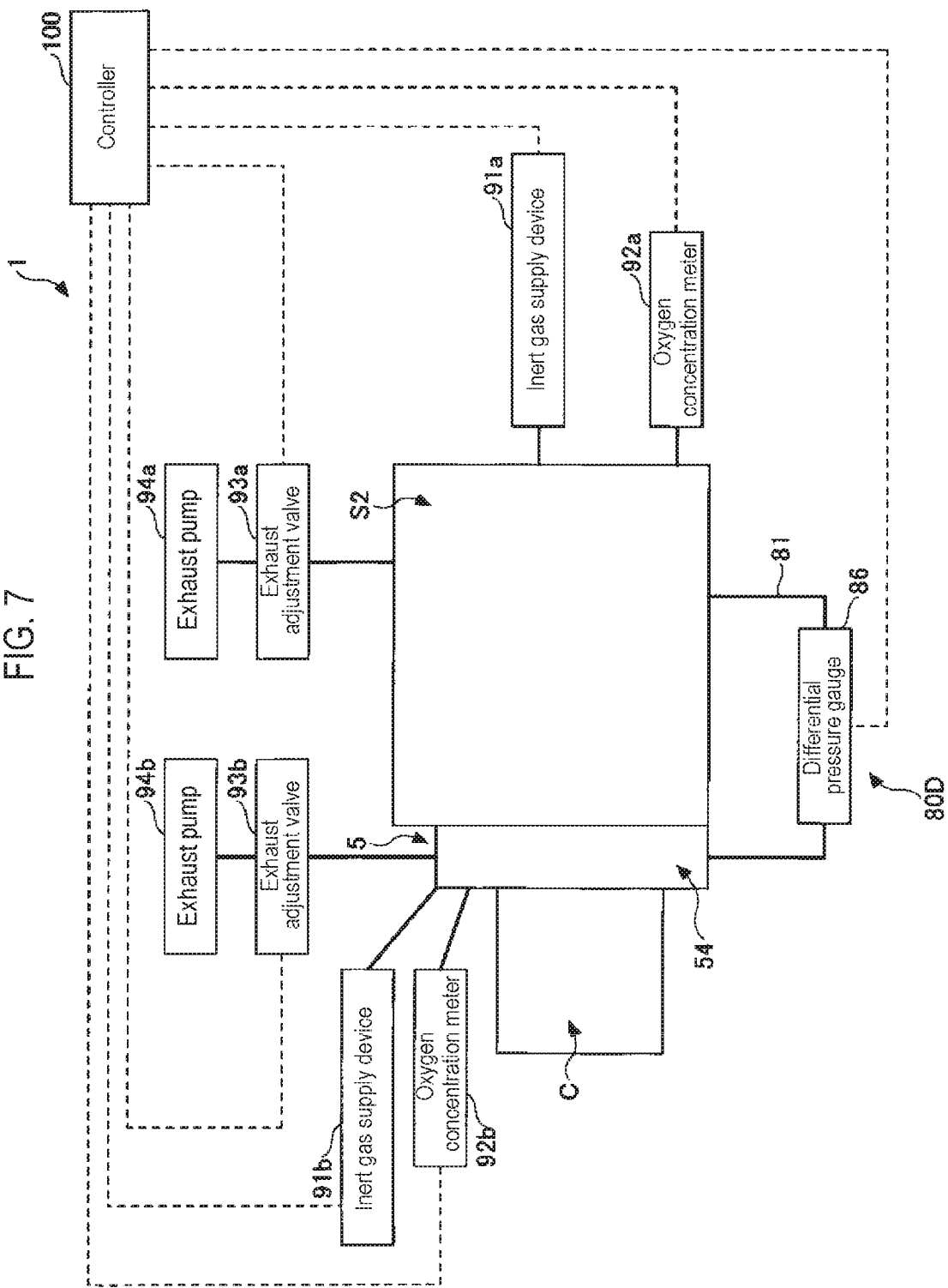
FIG. 7 is a schematic diagram illustrating a fourth configuration example of the pressure equalizing part of the substrate processing system in FIG. 1.

FIG. 7 is a schematic diagram illustrating a fourth configuration example of the pressure equalizing part of the substrate processing system in FIG. 1. In FIG. 7, a gas line is indicated by the thick solid line and an electric control system is indicated by the broken line. As illustrated in FIG. 7, a pressure equalizing part 80D of the fourth configuration example is different from that of the first configuration example, in that the pressure of the wafer transfer region S2 and the pressure of the closed space 54 are controlled so as to be substantially equal to each other based on a pressure difference between the wafer transfer region S2 and the closed space 54.

An inert gas supply device 91a, an oxygen concentration meter 92a, an exhaust adjustment valve 93a, an exhaust pump 94a, and the like are connected to the wafer transfer region S2. The inert gas supply device 91a supplies an inert gas such as an $N_2$ gas to the wafer transfer region S2 via the inert gas supply pipe 52 and the gas supply port 53 (see FIG. 3). The flow rate of the inert gas supplied from the inert gas supply device 91a is controlled by a controller 100. The oxygen concentration meter 92a detects a concentration of oxygen in the wafer transfer region S2 and transmits the detected value to the controller 100. The exhaust adjustment valve 93a is a valve for controlling the flow rate of the inert gas to be discharged by the exhaust pump 94a. An opening degree of the exhaust adjustment valve 93a is controlled by the controller 100.

An inert gas supply device 91b, an oxygen concentration meter 92b, an exhaust adjustment valve 93b, an exhaust pump 94b, and the like are connected to the closed space 54. The inert gas supply device 91b supplies an inert gas such as an $N_2$ gas to the closed space 54. The flow rate of the inert gas supplied from the inert gas supply device 91b is controlled by the controller 100. The oxygen concentration meter 92b detects a concentration of oxygen in the closed space 54 and transmits the detected value to the controller 100. The exhaust adjustment valve 93b is a valve for controlling the flow rate of the inert gas to be discharged by the exhaust pump 94b. An opening degree of the exhaust adjustment valve 93b is controlled by the controller 100.

The pressure equalizing part 80D includes the connection pipe 81, a differential pressure gauge 86, and the controller 100.

The connection pipe 81 is a gas pipe for connecting the wafer transfer region S2 and the closed space 54. One end of the connection pipe 81 communicates with the wafer transfer region S2, and the other end thereof communicates with the closed space 54.

The differential pressure gauge 86 is installed in the connection pipe 81. The differential pressure gauge 86 is a pressure sensor configured to detect a difference between the pressure of the wafer transfer region S2 and the pressure of the closed space 54 in the connection pipe 81. The detected value detected by the differential pressure gauge 86 is transmitted to the controller 100.

The controller 100 adjusts the flow rate of the inert gas supplied from the inert gas supply device 91a and the opening degree of the exhaust adjustment valve 93a based on the oxygen concentration in the wafer transfer region S2 detected by the oxygen concentration meter 92a. The controller 100 adjusts the flow rate of the inert gas supplied from the inert gas supply device 91b and the opening degree of the exhaust adjustment valve 93b based on the oxygen concentration in the closed space 54 detected by the oxygen concentration meter 92b.

In addition, after controlling the oxygen concentration in the wafer transfer region S2 and the oxygen concentration in the closed space 54, based on the detected value detected by the differential pressure gauge 86, the controller 100 controls at least one of the pressure of the wafer transfer region S2 and the pressure of the closed space 54 so that the pressure of the wafer transfer region S2 and the pressure of the closed space 54 become substantially equal to each other. Specifically, the controller 100 adjusts at least one of the flow rate of the inert gas supplied from the inert gas supply device 91a, the flow rate of the inert gas supplied from the inert gas supply device 91b, the opening degree of the exhaust adjustment valve 93a, and the opening degree of the exhaust adjustment valve 93b. Thus, at least one of the pressure of the wafer transfer region 52 and the pressure of the closed space 54 is controlled such that the pressure of the wafer transfer region 52 and the pressure of the closed space 54 become substantially equal to each other. Therefore, when the opening/closing door 5 is separated from the edge portion of the transfer port 20, the flow of a gas does not occur from the wafer transfer region S2 toward the closed space 54 or from the closed space 54 toward the wafer transfer region S2. As a result, it is possible to suppress particles from scattering between the wafer transfer region 52 and the closed space 54.

In the fourth configuration example, there has been described a case where the controller 100 controls so that the pressure of the wafer transfer region S2 and the pressure of the closed space 54 become substantially equal to each other as an example, but the control part 1A may perform the aforementioned control operation instead of the controller 100.

Furthermore, in the aforementioned embodiment, the wafer W is an example of the substrate, and the wafer transfer region S2 is an example of the substrate transfer region. The inert gas supply device 91a is an example of the first inert gas supply device, and the inert gas supply device 91b is an example of the second inert gas supply device. The combination of the exhaust adjustment valve 93a and the exhaust pump 94a is an example of the first exhaust device, and the combination of the exhaust adjustment valve 93b and the exhaust pump 94b is an example of the second exhaust device.

According to the substrate processing apparatus of the present disclosure, it is possible to suppress particles from scattering.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a carrier transfer region in which a carrier that accommodates a substrate is transferred to a substrate processing apparatus, and a substrate transfer region in which the substrate accommodated in the carrier is transferred to a processing furnace, the substrate transfer region being partitioned from the carrier transfer region by a partition wall;
a transfer port formed in the partition wall and through which the substrate is transferred between the carrier transfer region and the substrate transfer region;
an opening/closing door configured to open and close the transfer port; and
a pressure equalizing part configured to substantially equalize a pressure of the substrate transfer region and a pressure of a space surrounded by the carrier and the opening/closing door,
wherein the pressure equalizing part includes:
a first connection pipe through which a gas in the substrate transfer region flows to the space when the pressure of the substrate transfer region is higher than the pressure of the space;
a first check valve installed in the first connection pipe;
a first filter installed in the first connection pipe;
a second connection pipe through which a gas in the space flows to the substrate transfer region when the pressure of the substrate transfer region is lower than the pressure of the space;
a second check valve installed in the second connection pipe; and
a second filter installed in the second connection pipe.

2. The system of claim 1, wherein the pressure equalizing part further includes:
a first opening/closing valve installed in the first connection pipe; and
a second opening/closing valve installed in the second connection pipe.

3. The system of claim 1, wherein the pressure equalizing part further includes:
a first orifice installed in the first connection pipe; and
a second orifice installed in the second connection pipe.

4. The system of claim 1, wherein each of the first connection pipe and the second connection pipe is formed of fluororesin.

5. The system of claim 1, wherein the pressure equalizing part further includes:
a differential pressure gauge configured to detect a difference between the pressure of the substrate transfer region and the pressure of the space; and a controller configured to control at least one of the pressure of the substrate transfer region and the pressure of the space based on a detected value detected by the differential pressure gauge so that the pressure of the substrate transfer region and the pressure of the space become substantially equal to each other.

6. The system of claim 5, further comprising:
a first inert gas supply device configured to supply a first inert gas to the substrate transfer region;
a first exhaust device configured to discharge a first gas in the substrate transfer region;
a second inert gas supply device configured to supply a second inert gas to the space; and
a second exhaust device configured to discharge a second gas in the space,
wherein the controller is configured to adjust at least one of a flow rate of the first inert gas supplied from the first inert gas supply device, a flow rate of the second inert gas supplied from the second inert gas supply device, a flow rate of the first gas discharged from the first exhaust gas supply device, and a flow rate of the second gas discharged from the second exhaust device.

* * * * *